(12) United States Patent
Lam

(10) Patent No.: US 7,880,193 B2
(45) Date of Patent: Feb. 1, 2011

(54) METHOD FOR FORMING AN INTEGRAL ELECTROMAGNETIC RADIATION SHIELD IN AN ELECTRONIC PACKAGE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/617,577

(22) Filed: Nov. 12, 2009

(65) Prior Publication Data

US 2010/0051343 A1    Mar. 4, 2010

Related U.S. Application Data

(62) Division of application No. 11/315,903, filed on Dec. 22, 2005, now Pat. No. 7,626,247.

(51) Int. Cl.
*H01L 21/50* (2006.01)
(52) U.S. Cl. ............... 257/106; 438/113; 438/460; 257/659; 257/660; 257/E21.499
(58) Field of Classification Search ........... 257/659, 257/660, E21.499; 438/113, 106, 460
See application file for complete search history.

(56) References Cited

U.S. PATENT DOCUMENTS

| | | | |
|---|---|---|---|
| 6,424,024 | B1 | 7/2002 | Shih et al. |
| 6,812,566 | B2 | 11/2004 | Rabadam et al. |
| 6,894,929 | B2 | 5/2005 | Matsuoka et al. |
| 6,903,304 | B1 | 6/2005 | McLellan et al. |
| 6,905,891 | B2 | 6/2005 | Kovar et al. |
| 7,626,247 | B2 | 12/2009 | Lam et al. |
| 2002/0129951 | A1 | 9/2002 | Babb et al. |
| 2002/0153582 | A1 | 10/2002 | Takehara et al. |
| 2002/0196615 | A1 | 12/2002 | MacDonald et al. |
| 2004/0178500 | A1 | 9/2004 | Usui |

(Continued)

FOREIGN PATENT DOCUMENTS

CN    1378420    6/2002

(Continued)

OTHER PUBLICATIONS

"International Application PCT/US2006/049046, International Search Report mailed Apr. 7, 2008", 1 pg.

(Continued)

*Primary Examiner*—Victor Mandala
(74) *Attorney, Agent, or Firm*—Schwegman, Lundberg, Woessner, P.A.

(57) ABSTRACT

A method and system for fabricating an integral electromagnetic radiation shield for an electronic package is disclosed. Various embodiments include exposing a portion of at least one ground contact feature in an electronic package by removing a portion of the electronic package above the at least one ground contact feature to form at least one trench above the at least one ground contact feature; depositing electromagnetic radiation shield material in the at least one trench to substantially fill the at least one trench with a trench deposit; and depositing additional electromagnetic radiation shield material over a substantial portion of the electronic package, wherein the electromagnetic radiation shield material in the trench and over the substantial portion of the electronic package form an integral electromagnetic radiation shield which is electrically connected to the at least one ground contact feature.

19 Claims, 4 Drawing Sheets

U.S. PATENT DOCUMENTS

2006/0145361 A1* 7/2006 Yang et al. .............. 257/787
2007/0145539 A1  6/2007 Lam

FOREIGN PATENT DOCUMENTS

| TW | 200624032 | 7/2006 |
| --- | --- | --- |
| WO | WO-2007076022 A2 | 7/2007 |
| WO | WO-2007076022 A3 | 7/2007 |

OTHER PUBLICATIONS

"International Application PCT/US2006/049046, Written Opinion of the International Searching Authority mailed Apr. 7, 2008", 4 pgs.

"Taiwan Application Serial No. 095147839, Office Action mailed, Jan. 29, 2010", 6 pgs.

"U.S. Appl. No. 11/315,903, Non-Final Office Action mailed Feb. 3, 2009", 6 pgs.

"U.S. Appl. No. 11/315,903, Non-Final Office Action mailed Oct. 16, 2008", 8 pgs.

"U.S. Appl. No. 11/315,903, Response filed Feb. 5, 2007 to Restriction Requirement mailed Nov. 21, 2007", 6 pgs.

"U.S. Appl. No. 11/315,903, Restriction Requirement mailed Nov. 21, 2007", 5 pgs.

"U.S. Appl. No. 11/315,903, Non-Final Office Action mailed Mar. 18, 2008", 12 pgs.

"U.S. Appl. No. 11/315,903, Response filed Jan. 16, 2009 to Final Office Action mailed Oct. 16, 2008", 10 pgs.

"U.S. Appl. No. 11/315,903, Response filed Jun. 18, 2008 to Non-Final Office Action mailed Mar. 18, 2008", 10 pgs.

"U.S. Appl. No. 11/315,903, Notice of Allowance mailed Sep. 16, 2009", 6 pgs.

"U.S. Appl. No. 11/315,903, Response filed Jun. 3, 2009 to Non Final Office Action mailed Feb. 3, 2009", 9 pgs.

"Taiwan Application Serial No. 095147839, Office Action mailed Jun. 25, 2010", 7 pgs.

"Chinese Application Serial No. 200680048586.2, Office Action mailed Apr. 30, 2010", (w/ English Translation), 9 pgs.

Taiwan Application Serial No. 095147839, Response filed May 28, 2010 to Office Action mailed, Jan. 29, 2010 (w/ English Translation), 21 pgs.

* cited by examiner

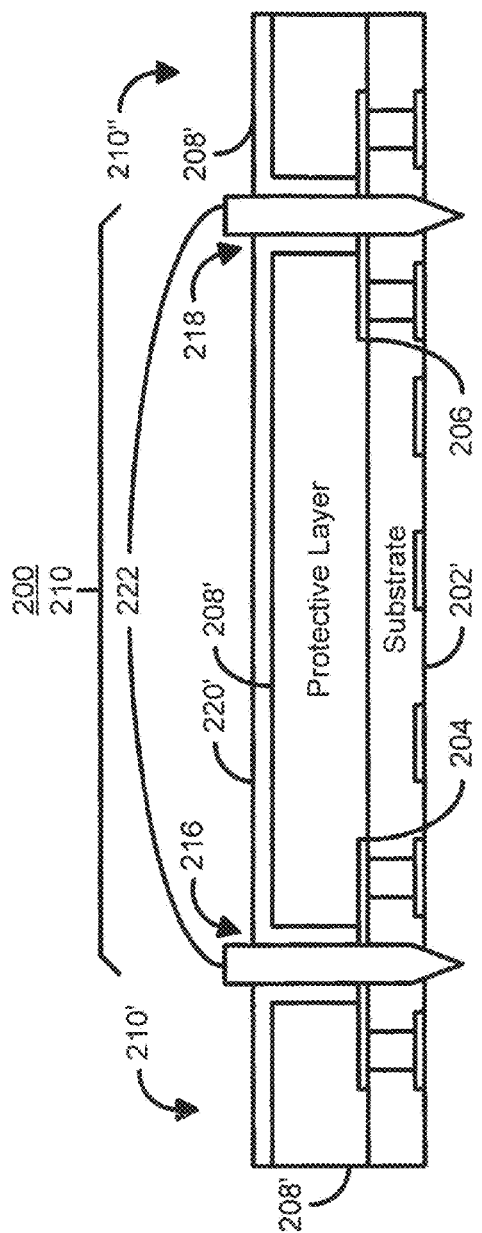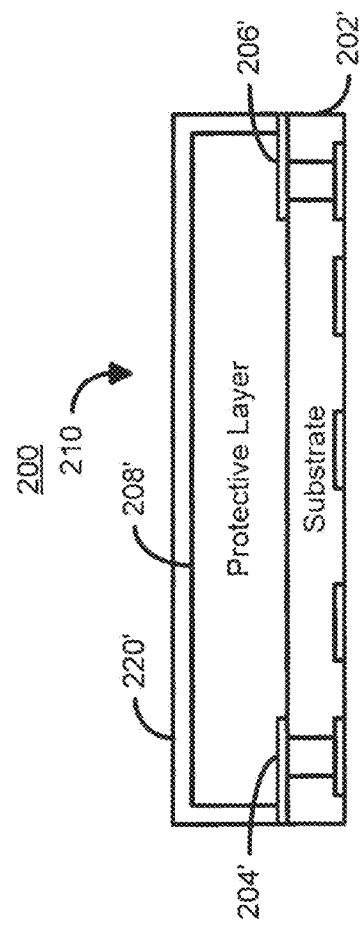

METHOD FOR FORMING AN INTEGRAL ELECTROMAGNETIC RADIATION SHIELD IN AN ELECTRONIC PACKAGE

RELATED APPLICATIONS

This application is a divisional of U.S. patent application Ser. No. 11/315,903, filed on Dec. 22, 2005 now U.S. Pat. No. 7,626,247, which is incorporated herein by reference in its entirety.

FIELD

The subject matter of the present invention relates to electronics packaging and more particularly to a method and system for fabricating an integral electromagnetic radiation shield in an electronics package.

BACKGROUND

Conventional electronics used in certain applications emit high frequency electromagnetic radiation that can interfere with the performance of other devices. For example, conventional microelectronic radio frequency (RF) devices emit RF radiation. RF radiation may adversely affect the performance of other electronic components, such as certain molded array packages (MAPS) or other semiconductor packages, used in conjunction with the conventional microelectronic RF device.

In order to protect other conventional electronic components from RF radiation, an electromagnetic radiation shield is provided between the conventional microelectronic RF device and other conventional electronic components. Typically this is performed by surrounding the other conventional electronic components with a physical shield. The physical shield is typically composed of an electrically conductive metallic media. For example, a conventional metal cover may be provided for each conventional electronic component desired to be shielded. In some conventional electronic components, the metal cover might include through holes that facilitate placement of mold compound that might be used as a protective layer for the underlying electronic device.

Although conventional metal shields can reduce the interference due to the RF radiation, one of ordinary skill in the art will readily recognize that such conventional metal covers are costly to fabricate. Typically, such conventional metal shields are custom designed for individual conventional electronic components. In addition, custom assembly equipment is typically used for assembling the conventional metal cover and attaching the conventional metal cover to the component. The custom assembly and design are typically expensive.

In addition, the conventional metal cover may also increase the size of the conventional electronic component being shielded. This increase in the size of the conventional electronic component may result in an increase in size of the final product employing the conventional electronic component. Typically, such an increase in size is undesirable. Consequently, use of conventional metal covers may be costly and undesirable for other reasons.

SUMMARY

The subject matter of the present invention provides a method and system for fabricating a shield for an electronics package. The subject matter of the present invention may be applied to various types of organic and inorganic substrate based electronics packages. The typical package type is a Molded Array Package (MAP). The electronics package includes a substrate, at least one ground contact feature, and a protective layer. The electronics package is physically coupled to at least one additional electronics package through at least the substrate. The method and system comprise exposing a portion of the at least one ground contact feature, preferably during a singulation process. The exposing step forms at least one trench above the at least one ground contact feature. The method and system also comprise depositing a metal shielding material that substantially covers the top surfaces and side surfaces of the electronics package, filling the trenches, and is electrically connected to the at least one ground contact feature on each electronic package substrate site.

According to the method and system disclosed herein, the present invention provides an integral RF shield that may be lower in cost.

BRIEF DESCRIPTION OF THE DRAWINGS

FIGS. 2-7 depict side views of a semiconductor package including an electromagnetic radiation shield during fabrication in accordance with an example embodiment of the present invention.

DETAILED DESCRIPTION OF THE INVENTION

The subject matter of the present invention relates to electronics packages utilizing electromagnetic shielding. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The subject matter of the present invention provides a method and system for fabricating an electromagnetic radiation shield for an electronics package. The electronics package includes a substrate, at least one ground contact feature, and a protective layer. The electronics package is physically coupled to at least one additional electronics package through at least the substrate. The method and system comprise exposing a portion of the at least one ground contact feature by removing a portion of the electronics package above the ground contact feature. The exposing step forms at least one trench above the at least one ground contact feature. The method and system also comprise depositing an electromagnetic radiation shield that substantially covers the electronics package, fills the at least one trench, and is electrically connected to the at least one ground contact feature. The method and system also comprise separating the electronics package from the at least one additional electronics package such that a remaining portion of the electromagnetic radiation shield substantially enclosing a portion of the electronics package above the ground contact feature that remains.

The subject matter of the present invention will be described in terms of particular components and particular electronics packages, such as MAPs. However, one of ordinary skill in the art will readily recognize that other and/or additional components and other and/or additional electronics packages could be used. For example, the subject matter of the present invention may be applied to various types of electronics packages that use a leadframe array or substrate array strip format such that each strip contains multiple repeat individual sites for package assembly. In addition, the present invention is described in the context of particular methods. One of ordinary skill in the art will, however, readily recognize that other methods having other and/or additional steps could be used.

Figure 1:
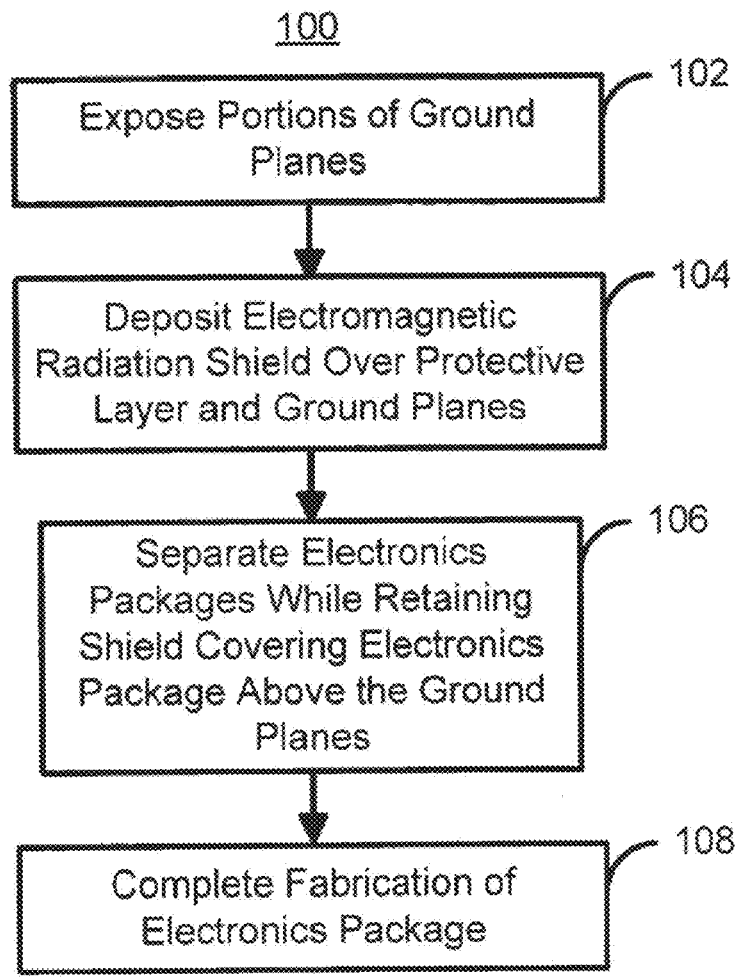
FIG. 1 is a flow chart depicting a method for providing an electromagnetic radiation shield in an electronics package in accordance with an example embodiment of the present invention.

FIG. 1 is a flow chart depicting one embodiment of a method 100 for providing an electromagnetic radiation shield in accordance with the present invention in an electronics package. FIGS. 2-7 depict a side view of one embodiment of an electronics package 210, a MAP, including one embodiment of an electromagnetic radiation shield in accordance with the present invention during fabrication. Referring to FIGS. 1-7, the method 100 is described in the context of the MAP 210. However, one of ordinary skill in the art will readily recognize that the method 100 can be used with other semiconductor packages. In addition, one of ordinary skill in the art will readily recognize that the electromagnetic radiation shield, described below, could be used with other semiconductor packages.

Figure 2:
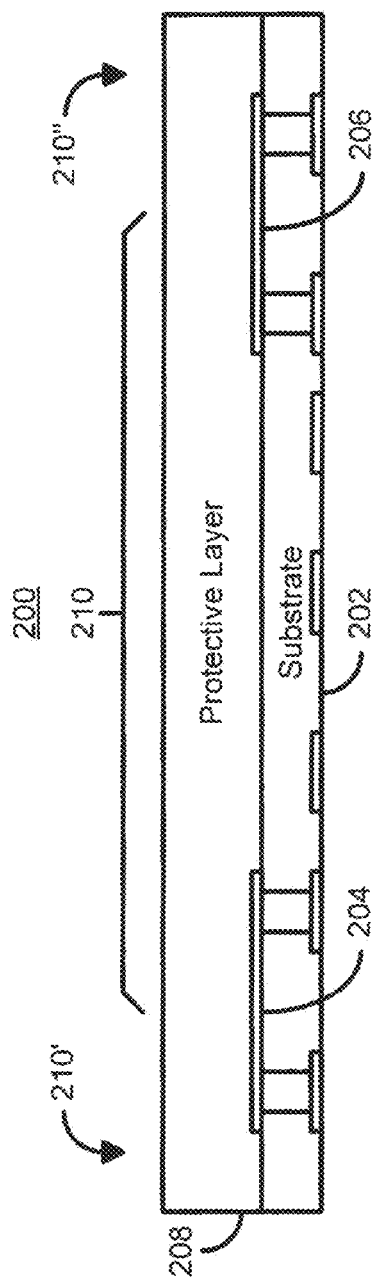

FIG. 2 depicts the substrate strip 200 including the MAP 210 prior to fabrication of one embodiment of the electromagnetic radiation shield in accordance with the present invention. In forming the MAP 210, multiple electronic dice and/or other components are attached and electrically connected to each site on the leadframe array or substrate array first, mass over-molded and then singulated into individual electronic packages such as the MAP 210. The substrate strip 200 shown thus includes a substrate 202, ground contact features 204 and 206, and a protective layer 208. The MAP substrates 202 are typically fabricated with an organic substrate core material, such as polyamide, BT resin or FR-4, FR-5 material. The circuitry metal for these substrates 202, such as for ground contact feature 204 and 206, is typically copper. These substrates can have metal circuitry on both sides of the organic core, multi-layer metal (4, 6, 8 or more metal layers are also used).

A solder mask layer (not shown), typically made with an epoxy base material, coats both top and bottom metal layers exposing the bond pad regions (not shown) and or component attach regions (not shown) on the top and solderball attach regions (not shown) at the bottom of the substrate strip 200. The exposed metal is over-plated with typically nickel and gold metal to facilitate wire bonding and soldering. The ground contact features 204 and 206 may have a variety of shapes such as a pad, a line, or a frame. However, ground contact features 204 and 206 are depicted as ground planes. In addition, the ground planes 204 and 206 are preferably designed to be at the extreme external edge of the individual electronic package substrate site. During the MAP packaging assembly process, discrete components (not shown), if present, are first attached to the individual package substrate sites of the substrate strip 200 by soldering or epoxy.

The dice (not shown) and/or components (not shown) are attached to individual sites and wirebonded or flip-chip soldered. The substrate strip is then overmolded using the protective layer 208. The protective layer 208 is typically an epoxy mold compound. Consequently, the MAP 210 is physically coupled to additional MAPs 210' and 210" through at least the substrate 202. In the embodiment shown, the MAP 210 is coupled to the MAPS 210' and 210" through the substrate 202, the ground planes 204 and 206, respectively, and the protective layer 208. As discussed above, in the embodiment shown, in which the electronics package 210 being fabricated is a MAP, the protective layer 208 is an over-mold compound. Thus, in one embodiment, the protective layer 208 includes an epoxy mold that has been over-molded to the substrate 202. The MAP 210 also generally includes other active and/or passive electronic components that have been attached, bonded, and electrically coupled with portions of the substrate 202. However, for simplicity, such electronic components are not shown.

Referring to FIGS. 1 and 2, a portion of the ground planes 204 and 206 are exposed by removing a portion of the electronics package above the ground planes 204 and 206, respectively, via step 102. Step 102 is typically is performed during the singulation step, which is used to separate the MAPs 210, 210' and 210". A saw or laser is preferably used to perform the portion of the singulation in step 102. The saw or laser cuts through the total thickness of the protective layer 208 and stops at the substrate strip's "top" surface exposing the ground planes 204 and 206. In the embodiment shown, step 102 is preferably performed by utilizing a wide saw blade to cut into the MAP 210, stopping at the ground planes 204 and 206. The wide saw blade is wider than a blade use to separate the packages. The typical range of widths for the saw blade used to partially cut the MAP (i.e. used in step 102) is 0.002" to 0.010" wider than the MAP singulation saw blade used in step 108. However, depending on the ground contact feature size design, the saw blade width can vary.

Figure 3:
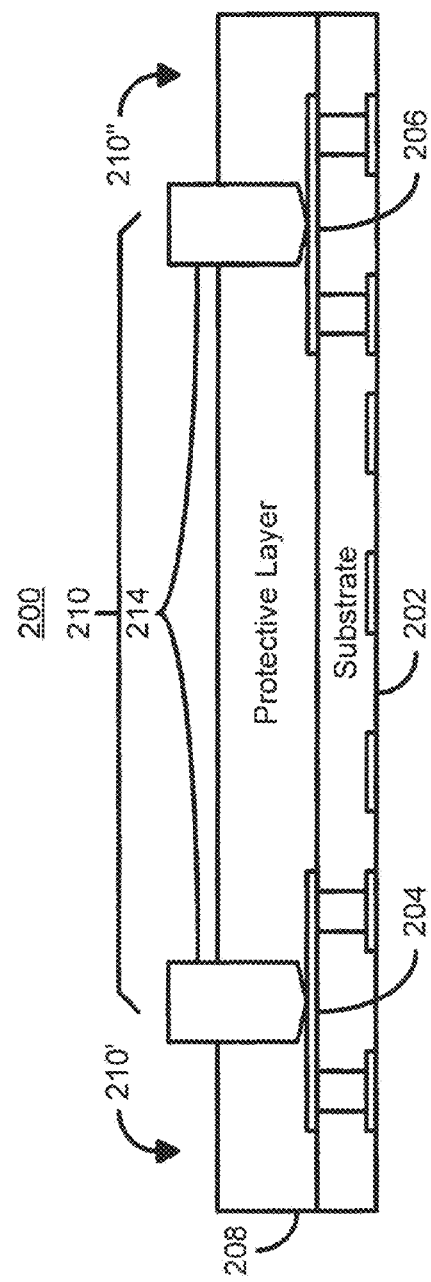
Figure 4:
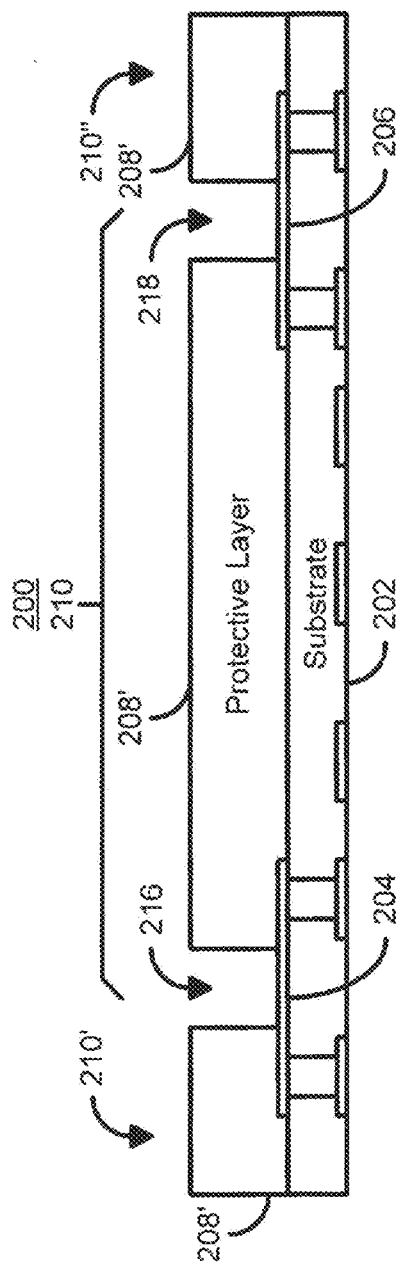

FIG. 3 depicts substrate the strip 200 including the MAP 210 during step 102. Thus, the saw blade(s) 214 used in exposing the ground planes 204 and 206 are shown. Note that in one embodiment a single saw blade 214 is used multiple times to make the cuts. FIG. 4 depicts the substrate strip 200 including the MAP 210 after step 102 has been completed. Thus, the ground planes 204 and 206 are exposed. In addition, the ground planes 204 and 206 have not been cut through by the saw blades 214. Thus, trenches 216 and 218 above the ground planes 204 and 206, respectively, have been formed.

An electromagnetic radiation shield material is deposited, via step 104. Step 104 preferably includes conformally depositing a metallic material over the surface of the devices 210, 210' and 210", particularly including the protective layer 208 and ground planes 204 and 206. In one embodiment, the metallic material includes materials such as Ni and/or Fe. In another embodiment, the metallic material may be a metal-polymer composite material. Various methods could be used to provide the electromagnetic radiation shield. For example, in various embodiments, screen printing, spraying and curing, stencil printing, brushing, and/or vacuum depositing may be used to provide the electromagnetic shield.

Figure 5:
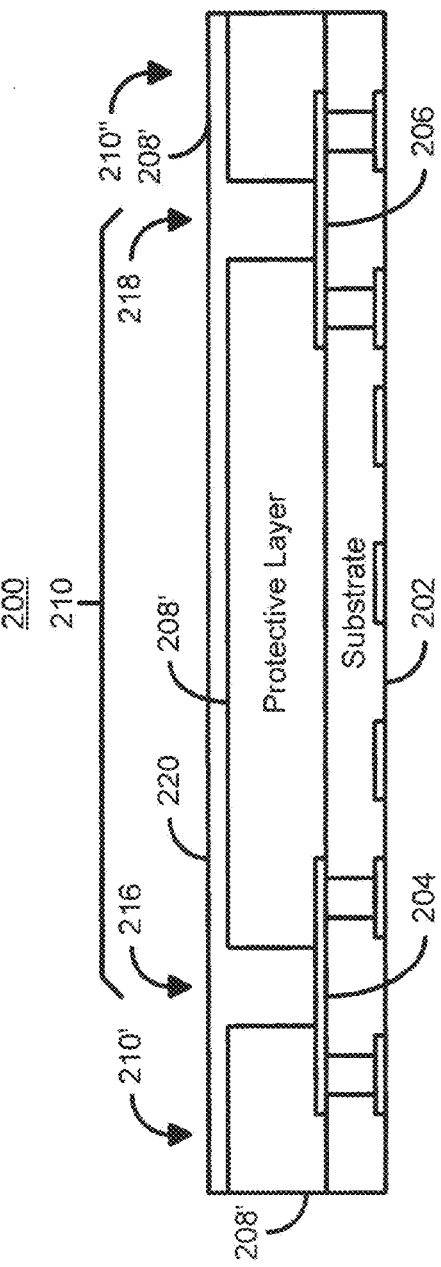

FIG. 5 depicts substrate the substrate strip 200 including the MAP 210 after step 104 has been performed. Thus, the electromagnetic shield 220 has been deposited. The electromagnetic shield 220 substantially covers the electronic package 210. In addition, the electromagnetic shield 210 substantially fills the trenches 216 and 218. The electromagnetic shield 210 is also electrically coupled with the ground planes 204 and 206. The electromagnetic shield 220 thus substantially covers the top surfaces and side surfaces of the MAP 210, filling all the saw/laser cut trenches 216 and 218, and is electrically connected to the ground planes 204 and 206 on each electronic package substrate site. Stated differently, the substrate strip may be completely coated with metal. However, as can be seen in FIG. 5, the MAPS 210, 210', and 210" are still physically connected. In a preferred embodiment, after step 104 is performed, package solderballs (not shown), if used, may be attached to the bottom of the substrate strip.

The MAP 210 is separated from the additional MAPs 210' and 210", via step 106. Thus, the singulation process is completed in step 106. Step 106 is performed such that a remaining portion of the electromagnetic radiation shield 220 still substantially encloses the portion of the MAP 210 above the one ground planes 204 and 206. Stated differently, step 106 is performed such that the electromagnetic shield 210 is still capable of functioning as a shield. The cut performed in step 106 may be performed using a laser or a saw. The saw or laser is preferably configured to cut through the mid-point of the trenches 216 and 218. In the embodiment shown, step 106 is performed using a saw blade that is thinner than the saw blade used in step 102. In addition, the saw blade would cut through not only the shield 220, but also the ground planes 204 and 206, as well as the substrate 202. Once the MAP 210 is separated from the additional MAPs 210' and 210", any further fabrication of the MAP 210 may be completed.

FIG. 6 depicts the substrate strip 200 including the MAP 210 during step 106. Thus, thinner saw blades 222 are shown. The saw blades 222 cut through the shield 220, the ground planes 204' and 206', as well as the substrate 202'. Thus, the MAPs 210, 210', and 210" are singulated to individual packages. Note that although multiple saw blades 222 are, shown, in one embodiment a single saw blade 222 is used multiple times to make the cuts. Because thinner saw blades 222 are used and because the saw blades 222 are positioned such that the shield 220' still substantially encloses the MAP 210 above the ground planes 204' and 206', the remaining portion of the electromagnetic shield 220' is still capable of functioning as an electromagnetic radiation shield. Thus, for example, the shield 220' may still be sufficiently effective at protecting the electronics (not explicitly shown) of the MAP 210 from RF radiation.

FIG. 7 depicts the MAP 210 after step 106 is completed. Because the MAP 210 was separated in step 106, the other MAPs 210' and 210" are not depicted. However, the MAPs 210' and 210" should also have shields (not shown) that are analogous to the shield 220'. As can be seen in FIG. 7, the shield 220' is integrated into the MAP 210. The shield 220' still substantially encloses the MAP 210 above the ground planes 204 and 206. The shield 220' substantially surrounds the portion of the MAP 210 from the ground planes 204' and 206' and above. Thus, the protective layer 208 is substantially surrounded. Thus, the remaining portion of the electromagnetic shield 220' is still capable of functioning as an electromagnetic radiation shield. Thus, for example, the shield 220' may still be sufficiently effective at protecting the electronics (not explicitly shown) of the MAP 210 from RF radiation. In addition, the shield 220' is formed directly on the MAP 210. In a preferred embodiment, the shield 220' if fabricated directly on the protective layer 208'.

Thus, using the method 100, the electronics package, here a MAP, 210 can be shielded using an integrated shield 220'. The method 100 may utilize conventional processes in preparing the MAP 210 for the shield 220', in depositing the shield 220, and in separating the MAP 210 from remaining MAPs 210' and 210". As a result, the shield 220' is relatively simple to fabricate and incorporate into fabrication of the MAP 210, 210', and 210". Consequently, custom designing of a shield and custom fabrication of the shield using tools specifically for the shield and the particular electronics package can be avoided. Inclusion of the shield 220' in the MAP 210' may thus be more cost effective. In addition, the shield 220' is preferably integrated into the MAP 210' and directly on the protective layer 208'. Consequently, the shield 220' may not significantly increase the size of the MAP 210'. Thus, the shield 220' may also avoid undue increases in size of the MAP 210' and/or any final product employing the MAP 210'.

A method and system for more easily providing an electromagnetic radiation shield for an electronics package are described. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

The invention claimed is:

1. A method comprising:
    exposing a portion of at least one ground contact feature in an electronic package, the electronic package located on a substrate and having a first portion located above the at least one ground contact feature and a second portion located directly on the substrate, wherein the exposing comprises removing the first portion of the electronic package form at least one trench above the at least one ground contact feature;
    depositing electromagnetic radiation shield material in the at least one trench to form a substantially filled the at least one trench; and
    depositing additional electromagnetic radiation shield material portion on top of the at least one substantially filled trench and on top of the second portion of the electronic package to form an integral electromagnetic radiation shield which is electrically connected to the at least one ground contact feature.

2. The method of claim 1 wherein the electronic package is a molded array package.

3. The method of claim 1 wherein the first portion of the electronic package is a first portion of a protective layer, and the second portion of the electronic package is a second portion of the protective layer.

4. The method of claim 3 wherein the protective layer is an over-mold compound.

5. The method of claim 4 wherein the removing further comprises sawing through the first portion of the protective layer using a first saw blade.

6. The method of claim 5 wherein the electronic package is physically coupled to at least one additional electronic package through at least the substrate.

7. The method of claim 6 further comprising separating the electronic package from the at least one additional electronic package wherein a remaining portion of the electromagnetic radiation shield substantially encloses a portion of the electronic package above the at least one ground contact feature.

8. The method of claim 7 wherein the separating further comprises sawing through the substrate and a portion of the electromagnetic radiation shield above the at least one ground contact feature using a second saw blade thinner than the first saw blade.

9. The method of claim 1 wherein the electromagnetic radiation shield is a metallic shield.

10. The method of claim 9 wherein the metallic shield includes at least one of Ni and Fe.

11. The method of claim 1 wherein the electromagnetic radiation shield is a metal-polymer composite.

12. The method of claim 1 wherein the electromagnetic radiation shield is a radio frequency shield.

13. A product produced according to the method of claim 1.

14. A method comprising:
    providing an electronic package having a substrate, at least one ground contact feature and a protective layer, wherein the protective layer has a first portion located above the at least one ground contact feature and a second portion located directly on the substrate, wherein the electronic package is physically coupled to at least one additional electronic package through at least the substrate;

exposing a portion of the at least one ground contact feature by removing the first portion of the protective layer to form at least one trench above the at least one ground contact feature;

depositing an electromagnetic radiation shield material to substantially cover the electronic package, to substantially fill the at least one trench with a trench deposit, and to electrically connect the at least one trench to the at least one ground contact feature, wherein the trench deposit forms a sidewall between adjacent electronic components; and separating the electronic package from the at least one additional electronic package, wherein a remaining portion of the electromagnetic radiation shield substantially encloses a portion of the electronic package above the at least one ground contact feature.

15. The method of claim 14 wherein the protective layer comprises an over-mold compound.

16. The method of claim 15 wherein the removing further comprises sawing through the first portion of the protective layer using a first saw blade.

17. The method of claim 16 wherein the separating further comprises sawing through the substrate and a portion of the electromagnetic radiation shield above the at least one ground contact feature using a second saw blade thinner than the first saw blade.

18. The method of claim 14 wherein the separating step is a singulation process which forms singulated electronic packages.

19. A product produced according to the method of claim 14.

\* \* \* \* \*

UNITED STATES PATENT AND TRADEMARK OFFICE
CERTIFICATE OF CORRECTION

| | | |
|---|---|---|
| PATENT NO. | : 7,880,193 B2 | Page 1 of 1 |
| APPLICATION NO. | : 12/617577 | |
| DATED | : February 1, 2011 | |
| INVENTOR(S) | : Ken M. Lam | |

It is certified that error appears in the above-identified patent and that said Letters Patent is hereby corrected as shown below:

In column 6, line 19, in Claim 1, after "package" insert -- to --.

In column 6, line 22, in Claim 1, after "filled" delete "the".

In column 6, line 25, in Claim 1, after "material" delete "portion".

In column 8, line 8, in Claim 17, after "separating" delete "further".

Signed and Sealed this
Nineteenth Day of April, 2011

David J. Kappos
*Director of the United States Patent and Trademark Office*